United States Patent
Shoji et al.

(10) Patent No.: US 7,775,417 B2
(45) Date of Patent: Aug. 17, 2010

(54) METHOD OF PRODUCING CONDUCTIVE CIRCUIT BOARD

(75) Inventors: Takashi Shoji, Tokyo (JP); Takekazu Sakai, Tokyo (JP)

(73) Assignee: Showda Denko K.K., Tokyo (JP)

( * ) Notice: Subject to any disclaimer, the term of this patent is extended or adjusted under 35 U.S.C. 154(b) by 0 days.

(21) Appl. No.: 12/517,320

(22) PCT Filed: Dec. 17, 2007

(86) PCT No.: PCT/JP2007/074611

§ 371 (c)(1),
(2), (4) Date: Jul. 21, 2009

(87) PCT Pub. No.: WO2008/078664

PCT Pub. Date: Jul. 3, 2008

(65) Prior Publication Data

US 2010/0065615 A1    Mar. 18, 2010

(30) Foreign Application Priority Data

Dec. 27, 2006  (JP) ............................. 2006-351003

(51) Int. Cl.
*B23K 31/02* (2006.01)
*B05D 5/12* (2006.01)
*C23C 30/00* (2006.01)

(52) U.S. Cl. ................ 228/248.1; 228/233.2; 427/96.1

(58) Field of Classification Search ........................ None
See application file for complete search history.

(56) References Cited

U.S. PATENT DOCUMENTS

| | | | |
|---|---|---|---|
| 6,126,865 A * | 10/2000 | Haak et al. .................. | 252/512 |
| 6,468,582 B1 * | 10/2002 | Sakemi ....................... | 427/97.4 |
| 2001/0020744 A1 * | 9/2001 | Kuramoto et al. ............ | 257/738 |
| 2003/0236362 A1 * | 12/2003 | Bluem et al. ................ | 525/530 |
| 2004/0251561 A1 * | 12/2004 | Wilson et al. ............... | 257/788 |
| 2005/0207930 A1 | 9/2005 | Yamaguchi | |
| 2006/0043543 A1 * | 3/2006 | Wada et al. .................. | 257/666 |
| 2006/0043597 A1 * | 3/2006 | Wada et al. .................. | 257/772 |
| 2007/0090160 A1 * | 4/2007 | Masumoto ................... | 228/101 |
| 2007/0145103 A1 * | 6/2007 | Bednarz et al. ............. | 228/101 |
| 2007/0284136 A1 * | 12/2007 | Sakai et al. .................. | 174/255 |
| 2008/0173699 A1 * | 7/2008 | Shoji et al. ................ | 228/248.1 |
| 2009/0041990 A1 * | 2/2009 | Shoji et al. ................ | 428/195.1 |
| 2009/0056977 A1 * | 3/2009 | Shoji et al. .................. | 174/250 |
| 2009/0261148 A1 * | 10/2009 | Shoji et al. .................. | 228/203 |
| 2010/0009070 A1 * | 1/2010 | Shoji et al. .................. | 427/98.6 |
| 2010/0038411 A1 * | 2/2010 | Shoji et al. .................. | 228/223 |

FOREIGN PATENT DOCUMENTS

| | | |
|---|---|---|
| JP | 7-7244 A | 1/1995 |
| JP | 2005-174828 A | 6/2005 |
| JP | 2006-278650 A | 10/2006 |
| WO | 2006/104238 A1 | 10/2006 |

OTHER PUBLICATIONS

Funtai Kougaku Binran (Powder Technology Handbook), Second Edition; NDC 581; Society of Powder Technology, Ed.; Feb. 30, 1986.

* cited by examiner

*Primary Examiner*—Kiley Stoner
(74) *Attorney, Agent, or Firm*—Sughrue Mion, PLLC

(57) ABSTRACT

A method of producing a conductive circuit board including imparting tackiness through the use of a tackiness-imparting compound to the surface of the conductive circuit on a printed wiring board, attaching a solder powder to the tacky area and then heating the printed wiring board to melt the solder to form a solder circuit. The characteristic feature of this method is that the tackiness-imparted printed wiring board is kept in a liquid, etc at not more than 10° C. before attaching the solder powder.

14 Claims, No Drawings

METHOD OF PRODUCING CONDUCTIVE CIRCUIT BOARD

CROSS REFERENCE TO RELATED APPLICATION

This application is an application filed under 35 U.S.C. §111(a) claiming the benefit pursuant to 35 U.S.C. §119(e)(1) of the filing dates of Japanese Patent Application No. 2006-351003 filed Dec. 27, 2006 pursuant to 35 U.S.C. §111(b).

FIELD OF THE INVENTION

The present invention relates to a method of producing a solder circuit board. More specifically, the invention relates to a method of producing a conductive circuit board, wherein a solder layer is formed on the surface of a fine conductive circuit on a printed wiring board.

BACKGROUND ART

In recent years, printed wiring boards with circuit patterns formed on an insulator substrate such as a plastic substrate, a ceramic substrate, or a metal substrate coated with a plastic or the like have been developed, and the technique of creating electronic circuits by soldering electronic components like IC devices, semiconductor chips, resistors, and condensers on the circuit pattern has been widely used.

To bond the lead terminals of such electronic components to predetermined sites on the circuit pattern, in general, a thin layer of a solder is formed in advance on the surface of a conductive circuit on a board, a solder paste or flux is printed on it, predetermined electronic components are mounted at the decided positions, and the thin solder layer or the thin solder layer and solder paste are reflowed to establish solder connections.

Recently there has been a demand for solder circuit boards of finer pitch for miniaturizing electronic products. Many fine pitch components such as 0.3 mm pitch QFP (Quad Flat Package) LSIs and CSPs (Chip Size Packages), and 0.15 mm pitch FCs (Flip Chips) are mounted. Therefore, very fine and accurate solder circuit patterns that can accommodate such fine pitch are being demanded in solder circuit boards.

Methods such as plating, HAL (Hot Air Leveling), and printing with a paste of solder powder and then reflowing it are used to form the solder circuit made of a solder film on a printed wiring board. When producing solder circuits by the plating method, however, it is difficult to form a thick solder layer, whereas achieving a fine pitch pattern is difficult with the HAL method or the solder paste printing method.

A method of forming solder circuits not requiring the cumbersome operation of aligning the circuit pattern, etc, which comprises imparting tackiness to the surface of a conductive circuit on a printed wiring board through a reaction with a tackiness-imparting compound, attaching a solder powder to these tacky parts, and then heating the printed wiring board to melt the solder and form the solder circuit, has been disclosed (refer, for example, to JP-A HEI 07-7244).

The method of attaching a solder powder to a printed wiring board disclosed in JP-A HEI 07-7244 is a dry process. This method sometimes causes the attachment of solder powder by static electricity to parts where it is not required, scattering of the powder, etc. Therefore, a wet process in which the printed wiring board is immersed in a slurry containing solder powder, to attach the solder power to the tackiness-imparted area of the circuit, has been disclosed (refer, for example, to JP-A 2006-278650).

In the method disclosed in JP-A HEI 07-7244, metal in the circuit part of the printed wiring board is allowed to react with a substance such as a naphthotraizole derivative to form a metal complex on the metallic part, and the solder powder is attached with the help of the tackiness of this metal complex. The adhesive force of this metal complex diminishes with time, which makes it necessary to attach the solder powder to the tacky area promptly after imparting tackiness to the circuit part of the printed wiring board. Therefore, the throughput has to be matched between the process of imparting tackiness to the circuit part of the printed wiring board and the process of attaching the solder powder to the tacky area. Moreover, if the throughput of the solder powder-attaching process is reduced due to reasons like a problem with the equipment, tackiness-imparted boards accumulate and their tackiness gets diminished. When this happens, it becomes necessary to renew the tackiness of the circuit parts of such printed wiring boards.

The purpose of the present invention is to provide a method that enables the smooth production of conductive circuit boards by prolonging the retention of tackiness imparted to the circuit part of the printed wiring board, i.e., increasing a permissible waiting time between the process of imparting tackiness to the circuit part of the printed wiring board and the process of attaching solder powder to the tacky area, and thus solve the aforesaid problems.

DISCLOSURE OF THE INVENTION

The present inventors arrived at the present invention as a result of painstaking investigations aimed at solving the aforesaid problems. In short, the present invention relates to the following.

(1) A method of producing a conductive circuit board comprising imparting tackiness through the use of a tackiness-imparting compound to a surface of the conductive circuit on a printed wiring board, attaching a solder powder to the tacky area, and then heating the printed wiring board to melt the solder to form a solder circuit, wherein the printed wiring board is kept at not more than 10° C. after the tackiness is imparted and before the solder powder is attached.

(2) A method of producing a conductive circuit board comprising imparting tackiness through the use of a tackiness-imparting compound to a surface of the conductive circuit on a printed wiring board, attaching a solder powder to the tacky area, and then heating the printed wiring board to melt the solder to form a solder circuit, wherein the printed wiring board is kept in a liquid at not more than 10° C. after the tackiness is imparted and before the solder powder is attached.

(3) The method of producing a conductive circuit board according to (1) or (2) above, wherein the tackiness-imparting compound contains one or more substances selected from the group consisting of naphthotriazole derivatives, benzotriazole derivatives, imidazole derivatives, benzimidazole derivatives, mercaptobenozothiazole derivatives, and benzothiazole thiofatty acids.

(4) The method of producing a conductive circuit board according to (2) or (3) above, wherein the temperature of the liquid in which the printed wiring board is kept is not more than 10° C., and is not below the freezing temperature of the liquid.

(5) The method of producing a conductive circuit board according to any one of (2) to (4) above, wherein the liquid in which the printed wiring board is kept is water.

(6) The method of producing a conductive circuit board according to any one of (1) to (5), wherein the process of attaching the solder powder to the printed wiring board is carried out in a liquid containing the solder powder.

(7) The method of producing a conductive circuit board according to (6) above, wherein the liquid is water.

(8) The method of producing a conductive circuit board according to (6) or (7) above, wherein the solder powder concentration in the liquid is 0.5 to 10% by volume.

(9) The method of producing a conductive circuit board according to any one of (6) to (8) above, wherein the temperature of the liquid containing the solder powder at the time of attaching the solder powder to the printed wiring board is in the range of 30 to 45° C.

The present invention allows a longer permissible waiting time between processes in the production of printed wiring boards having fine circuit patterns and minute bumps, and therefore, can increase productivity in the production of such printed wiring boards by reducing need for reprocessing, etc arising from problems with the equipment, and the like.

BEST MODE FOR CARRYING OUT THE INVENTION

The present invention is described below, according to the sequence of the production process.

The printed wiring boards relevant to the present invention are one-sided printed wiring boards, two-sided printed wiring boards, multilayered printed wiring boards, flexible printed wiring boards, or the like, which have been prepared by forming a circuit pattern made of a conductive material like a metal, etc on an insulating substrate made of plastic, plastic film, glass fabric, epoxy resin-impregnated paper, a laminate of a ceramic or other substrate on a metal sheet, or a metal base material coated with plastic or ceramics, etc. Apart from this, the invention can be applied to the attachment of IC boards, condensers, resistors, coils, varistors, bare chips, wafers, etc.

Among these, it is preferable to use the present invention to create bumps for attaching BGAs (Ball Grid Arrays), and CSPs (Chip Size Packages).

In the present invention, tackiness is imparted to the surface of the conductive circuit on the aforesaid printed wiring board though a reaction with a tackiness-imparting compound, a solder powder is attached to the tacky area, and the printed wiring board is heated to melt the solder to first form a solder layer on the circuit board.

Copper is used in most cases as a conductive material to form a circuit. However, the conductive material is not limited to copper in the present invention. Any conductive material the surface of which can be made tacky by the tackiness-imparting substance discussed later can be used. Examples of such materials are substances containing Ni, Sn, Ni—Au, solder alloys, etc.

The tackiness-imparting compound used in the present invention is preferably a substance containing one or more substances selected from the group consisting of naphthotriazole derivatives, benzotriazole derivatives, imidazole derivatives, benzimidazole derivatives, mercaptobenozothiazole derivatives, and benzothiazole thiofatty acids. These tackiness-imparting compounds have a particularly strong effect on copper, but they can impart tackiness to other conductive materials as well.

In the present invention, the benzotriazole derivative is represented by general formula (1):

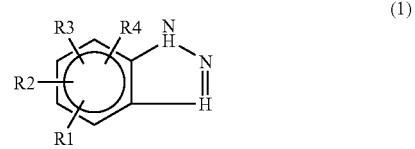

wherein each of R1 to R4 independently represents a hydrogen atom, an alkyl group or an alkoxy group having 1 to 16, preferably 5 to 16 carbon atoms, F, Br, Cl, I, a cyano group, an amino group, or an OH group.

The napthotriazole derivative is represented by general formula (2):

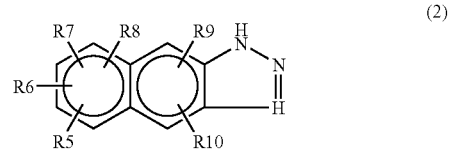

wherein each of R5 to R10 independently represents a hydrogen atom, an alkyl group or an alkoxy group having 1 to 16, preferably 5 to 16 carbon atoms, F, Br, Cl, I, a cyano group, an amino group, or an OH group.

The imidazole derivative is represented by general formula (3):

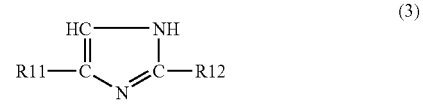

wherein each of R11 and R12 independently represents a hydrogen atom, an alkyl group or an alkoxy group having 1 to 16, preferably 5 to 16 carbon atoms, F, Br, Cl, I, a cyano group, an amino group, or an OH group.

The benzimidazole derivative is represented by general formula (4):

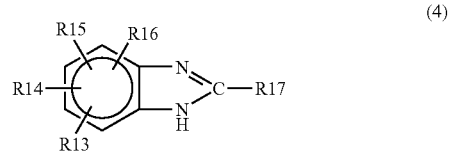

wherein each of R13 to R17 independently represents a hydrogen atom, an alkyl group or an alkoxy group having 1 to 16, preferably 5 to 16 carbon atoms, F, Br, Cl, I, a cyano group, an amino group, or an OH group.

The mercaptobenzothiazole derivative is represented by general formula (5):

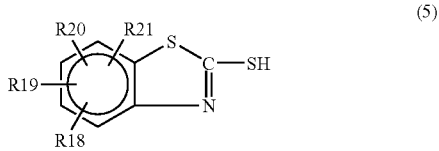
(5)

wherein each of R18 to R21 independently represents a hydrogen atom, an alkyl group or an alkoxy group having 1 to 16, preferably 5 to 16 carbon atoms, F, Br, Cl, I, a cyano group, an amino group, or an OH group.

The benzothiazole thiofatty acid derivative is represented by general formula (6):

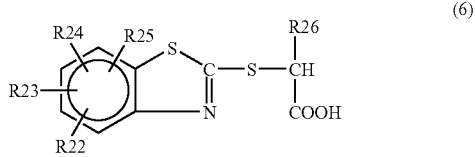
(6)

wherein each of R22 to R26 independently represents a hydrogen atom, an alkyl group or an alkoxy group having 1 to 16, preferably 1 or 2 carbon atoms, F, Br, Cl, I, a cyano group, an amino group, or an OH group.

Among these compounds, the benzotriazole derivatives represented by general formula (1) having a higher number of carbon atoms in R1 to R4 generally have higher tackiness.

Among the imidazole derivatives and the benzimidazole derivatives, respectively represented by general formula (3) and general formula (4), also those having more carbon atoms in R11 to R17 generally have higher tackiness.

Among the benzothiazole thiofatty acid derivatives represented by general formula (6), those having 1 or 2 carbon atoms in R22 to R26 are preferable.

In the present invention, at least one of these tackiness-imparting compounds, dissolved in water or acidic water preferably adjusted to weakly acidic pH of about 3 to 4, is used. When the conductive material is a metal, an inorganic acid such as hydrochloric acid, sulfuric acid, nitric acid or phosphoric acid may be used for adjusting pH. As an organic acid, formic acid, acetic acid, propionic acid, malic acid, oxalic acid, malonic acid, succinic acid, and tartaric acid may be used. Although the concentration of the tackiness-imparting compound is not strictly restricted, and the concentration needs to be adjusted, taking into account the compound's solubility and the conditions of its use, overall, the preferable range is 0.05% to 20% by mass, considering the ease in use. Concentrations lower than this will not properly form a tacky film, and therefore, are not preferable from the performance point of view.

A treatment temperature slightly higher than room temperature gives good rate and amount of tacky film formation. Although there is no restriction on the treatment temperature, which differs depending on the concentration of the tackiness-imparting compound, the type of metal, etc, 30 to 60° C. is generally the suitable range. It is preferable to adjust other conditions so that the immersion time is about 5 seconds to about 5 minutes, considering the operational efficiency, although there is no restriction on this.

In this process, coexistence of 10 to 5000 ppm of copper in the form of copper ions, in the solution is preferable, since this improves the efficiency of tacky film formation, i.e., the rate and amount of film formation.

For treating the printed wiring board with the solution of the tackiness-imparting compound, it is preferable to cover, with resist, etc, the parts of the conductive circuit that do not require the formation of a solder layer, and keep exposed only the parts of circuit pattern where the solder layer needs to be formed.

Furthermore, it is preferable to apply the method of producing a conductive circuit board of the present invention to the so-called single particle attachment, where only an individual solder ball is attached, for instance, to a minute circular electrode part formed on the printed wiring board. When producing printed wiring boards by the single particle attachment method, only one solder ball is attached to each electrode part. So, if the solder ball fails to get attached there, the printed wiring board becomes a defective product. Therefore, the adhesive force on the surface of the conductive circuit needs to be maintained at a high level, and thus it is a suitable case for using the production method of the present invention.

Here, the surface of the conductive circuit is made tacky by immersing the printed wiring board in the aforementioned tackiness imparting compound solution, or applying the solution on the printed wiring board.

When tackiness is imparted to the surface of the conductive circuit by the aforesaid method, the adhesive force can remain high enough to attach the solder powder only for about 10 minutes at 40° C., for example. In other words, when not employing the conductive circuit board production method of the present invention, it is necessary to carry out the next process, i.e., attaching the solder powder to the tacky area on the surface of the conductive circuit, within this duration of time for which the tackiness is retained.

In the present invention, to retain the tackiness, imparted to the surface of the conductive circuit, for a longer time, the tackiness-imparted printed circuit board is kept at not more than 10° C. before attaching the solder powder. The boards may be kept in air or in a gas, such as nitrogen atmosphere, but it is preferable to keep them in a liquid. When kept in this manner, the tackiness-imparted printed wiring board can retain the adhesive force for about 2 hours. In other words, in the conventional production method, the next process of attaching solder powder to the tacky areas of the conductive circuit surface had to be carried out within about 10 minutes after the tackiness is imparted to the printed wiring board, whereas with the production method of the present invention, the waiting time before the next process can be extended to about 2 hours. This permits greater freedom in setting of production conditions for the tackiness imparting process and the solder powder attaching process. Furthermore, the present invention can eliminate wasteful steps such as reprocessing of the printed circuit boards with diminished tackiness to increase their tackiness.

The detailed reasons for the tackiness not diminishing at 10° C. or less are not understood well. But, when we consider that the reasons for lowering of tackiness with time include qualitative changes of the surface, dissolution of the tacky compound, etc, we can hypothesize that such low temperatures would probably reduce the chemical reactivity of the tacky substance and lowers its solubility (when kept in liquid).

In the present invention, the printed wiring board with tackiness imparted to the surface of its conductive circuit is kept at not more than 10° C. to retain the tackiness for a longer time before attaching the solder powder. The lower limit of this keeping temperature is the freezing temperature of the tacky substance when keeping in a gas, and 0° C. or the freezing temperature of the liquid and the tacky substance when keeping in a liquid. Lowering the liquid temperature more than required would not have much effect on the retention of tackiness, and moreover, when keeping in liquid, control of the liquid temperature becomes difficult, as the liquid tends to freeze at such temperatures. In the present invention, water is the preferred liquid for keeping the printed wiring board in a liquid. The reasons for preferring water are that water does not have much adverse effect on the tacky substance and that it has a role in the tackiness development mechanism of the tacky substance.

Moreover, according to the present invention, naphthotriazole derivatives, benzotriazole derivatives, imidazole derivatives, benzimidazole derivatives, mercaptobenozothiazole derivatives, benzothiazole thiofatty acids, etc are used preferably as the tackiness-imparting compound, and water is most preferable for retaining the adhesive force of the metal complex formed by these compounds.

In the present invention, it is preferable to carry out the process of attaching the solder powder to the tacky area of the printed wiring board in a liquid containing the solder powder, and to maintain the temperature of the sold powder-containing liquid at 30 to 45° C. during this process. Attaching the solder powder to the tacky areas of the printed wiring board by this wet process can prevent the solder powder from getting attached by static electricity to parts where it is not required, and scattering of the powder, etc. Maintaining the temperature of the solder powder-containing liquid in the range 30 to 45° C. can maximize the adhesive power between the tacky parts and the solder powder.

To be more specific, to attach the solder powder in a liquid, the board is immersed horizontally in a container having a solder powder slurry. Further, the solder powder slurry is circulated with the help of a pump, and the outlet nozzle is kept directly above the electrode parts of the board. The board may be given ultrasonic vibrations.

The solder powder liquid used in the present invention has a solder powder concentration, in the liquid, preferably in the range of 0.5% to 10% by volume, more preferably 3% to 8% by volume.

Water is preferably used as the solvent in the solder powder liquid of the present invention. The use of deoxygenated water and adding an antirust agent to the water are preferred, for preventing oxidation of the solder powder by the water.

The metal composition of the solder powder used in the method of producing solder circuit boards according to the present invention can, for instance, be of the Sn—Pb, Sn—Pb—Ag, Sn—Pb—Bi, Sn—Pb—Bi—Ag, and Sn—Pb—Cd systems. Also, from the viewpoint of the recent trend of eliminating Pb from industrial wastes, Pb-free compositions like Sn—In, Sn—Bi, In—Ag, In—Bi, Sn—Zn, Sn—Ag, Sn—Cu, Sn—Sb, Sn—Au, Sn—Bi—Ag—Cu, Sn—Ge, Sn—Bi—Cu, Sn—Cu—Sb—Ag, Sn—Ag—Zn, Sn—Cu—Ag, Sn—Bi—Sb, Sn—Bi—Sb—Zn, Sn—Bi—Cu—Zn, Sn—Ag—Sb, Sn—Ag—Sb—Zn, Sn—Ag—Cu—Zn, and Sn—Zn—Bi systems are preferable.

Specific examples of the aforementioned compositions include 62Sn-36Pb-2Ag, 62.6Sn-37Pb-0.4Ag, 60Sn-40Pb, 50Sn-50Pb, 30Sn-70Pb, 25Sn-75Pb, 10Sn-88Pb-2Ag, 46Sn-8Bi-46Pb, 57Sn-3Bi-40Pb, 42Sn-42Pb-14Bi-2Ag, 45Sn-40Pb-15Bi, 50Sn-32Pb-18Cd, 48Sn-52In, 43Sn-57Bi, 97In-3Ag, 58Sn-42In, 95In-5Bi, 60Sn-40Bi, 91Sn-9Zn, 96.5Sn-3.5Ag, 99.3Sn-0.7Cu, 95Sn-5Sb, 20Sn-80Au, 90Sn-10Ag, 90Sn-7.5Bi-2Ag-0.5Cu, 97Sn-3 Cu, 99Sn-1 Ge, 92Sn-7.5Bi-0.5Cu, 97Sn-2Cu-0.8Sb-0.2Ag, 95.5 Sn-3.5Ag-1Zn, 95.5 Sn-4Cu-0.5Ag, 52Sn-45Bi-3 Sb, 51 Sn-45Bi-3 Sb-1Zn, 85 Sn-10Bi-5Sb, 84Sn-10Bi-5Sb-1Zn, 88.2Sn-10Bi-0.8Cu-1Zn, 89Sn-4Ag-7Sb, 88Sn-4Ag-7Sb-1Zn, 98Sn-1Ag-1Sb, 97Sn-1Ag-1Sb-1Zn, 91.2Sn-2Ag-0.8Cu-6Zn, 89Sn-8Zn-3Bi, 86Sn-8Zn-6Bi, 89.1Sn-2Ag-0.9Cu-8Zn, apart from the representative eutectic solder having 63% by mass of Sn and 37% by mass of Pb (hereinafter referred to as "63Sn-37Pb"). A mixture of 2 or more solder powders, each with a different composition, can also be used as the solder powder in the present invention.

As the thickness of the solder coat to be formed can be adjusted by changing the particle size of the solder power, the particle size of the solder powder is selected according to the thickness of the solder coat to be formed. For instance, it may be selected from the powders of size ranges 63 to 22 µm, 45 to 22 µm, and 38 to 22 µm, etc, separated by sieving, as specified in Japanese Industrial Standards (JIS), and solder balls of size 63 µm or larger.

A JIS method that employs standard sieves and a balance may be normally used for measuring the mean particle size of the solder powder in the present invention. Alternatively, microscopic image analysis, or a Coulter counter, which uses the electrozone sensing method, may be employed. The principle of the Coulter counter is described in "Funtai Kogaku Binran (Powder Engineering Handbook)", pp. 19 to 20, 2nd edition, compiled by the Powder Engineering Society. In this method, a solution in which the powder is dispersed is drawn through a small aperture on a diaphragm wall and the change in electrical resistance between the two sides of the aperture is measured to determine the particle size distribution of the powder, and the proportions of different particle sizes can be measured with high reproducibility. The mean particle size of the solder powder to be used in the present invention can be determined by one of the microtrack method.

In the reflow process for the attached solder powder in the present invention, preheating is performed at a temperature of 130 to 180° C., preferably 130 to 150° C., and the preheating duration is 60 to 120 seconds, preferably 60 to 90 seconds. Reflowing is performed at a temperature that is 20 to 50° C. higher, preferably 20 to 30° C. higher, than the melting point of the alloy, and the reflow time is 30 to 60 seconds, preferably 30 to 40 seconds.

The reflow process can be performed in a nitrogen atmosphere or in air. When the reflow process is performed in nitrogen atmosphere, keeping the oxygen concentration at not more than 5% by volume, preferably not more than 0.5% by volume, improves the wettability of the circuit portion with the solder, and reduces solder ball formation, making the processing more stable compared to when the reflowing is performed in air.

The solder circuit board prepared according to the present invention can be suitably used for mounting of electronic components, which involves mounting of the electronic components and bonding them to the board by reflow soldering. With the solder circuit boards prepared according to the present invention, for instance, the solder paste can be applied by printing, etc to the parts where the electronic components are to be attached, the electronic components placed at the required sites, heat applied to melt the solder powder in the solder paste, and the solder solidified to bond the electronic components to the circuit board.

The surface mounting technique (SMT) may be used, for instance for bonding (mounting) the solder circuit board with electronic components. In the SMT, a solder circuit board is first prepared according to the present invention or by printing a solder paste. The solder paste is applied, for instance, to the desired sites on the circuit pattern. Next, the electronic components such as chips and QFPs, to which the solder has been attached or reflowed according to the present invention, are mounted on the solder paste on the circuit pattern and solder-bonded collectively by reflow heating. A hot air oven, infrared oven, vapor condensation soldering apparatus, optical beam soldering machine, etc can be used as the reflow heat source.

The present invention is described below citing an example, without intending to restrict the scope of the invention.

Example 1

Comparative Example

Printed wiring boards with copper foil electrode parts having a minimum electrode spacing of 50 μm, and electrode diameter 80 μm were prepared.

A 2% by mass aqueous solution of an imidazole compound represented by general formula (3) wherein R12 is a $C_{11}H_{23}$ alkyl group and R11 is a hydrogen atom, the pH of which was adjusted to about 4 with acetic acid, was used as the tackiness-imparting compound solution. This aqueous solution was heated to 40° C., and the printed wiring board, which had been pretreated with aqueous hydrochloric acid, was immersed in the heated solution for 3 minutes to form a tacky substance on the surface of the copper circuit.

The boards were then kept in pure water under the different conditions shown in the Table. The boards were subsequently used for attaching solder powder.

A solder powder slurry was prepared by mixing about 20 g of 96.5 Sn-3.5Ag solder powder with a mean particle size of 70 μm (measured by a microtrack method) in about 100 g of deoxygenated pure water.

The solder powder slurry was placed in the tank and the outlet of the tank was set on the board to which tackiness had been imparted. The open and shut valve was then opened and the dispenser run over the board surface to discharge the solder powder slurry to cover the circuit.

The excess solder powder on the board was washed off with pure water, and the board dried.

The washed out solder powder was recovered and recycled for solder powder attachment. The conditions under which the printed wiring boards were kept and solder powder attachment status are given in the Table.

Table 1:

TABLE

| Conditions under which the boards were kept and status of solder powder attachment | | | | |
|---|---|---|---|---|
| Duration of keeping | Temperature maintained | | | |
| | 10° C. | 20° C. | 30° C. | 40° C. |
| 10 minutes | Good | Good | Good | Good |
| 30 minutes | Good | Good | Had parts without solder powder | Had parts without solder powder |
| 60 minutes | Good | Good | Had parts without solder powder | Had parts without solder powder |
| 90 minutes | Good | Had parts without solder powder | Had parts without solder powder | Had parts without solder powder |

Example 2

Tackiness-imparted printed wiring boards were kept in pure water for 90 minutes according to the method described in Example 1, and solder powder was attached to the printed wiring boards by immersing the board in a slurry. To be more specific, the slurry described in Example 1 was placed in a container and the slurry temperature was maintained at 40° C. After that, a tackiness-imparted printed wiring board that had been kept in pure cold water was immersed horizontally in the container. The slurry was then circulated with a pump and the slurry outlet was run over the surface of the printed wiring board so that the tacky areas of the circuit were covered with the slurry.

The parts of the circuit of the printed wiring board were examined after production, by the same method as used in Example 1. There were no parts without attached solder powder.

Example 3

Printed wiring boards with electrode diameter 70 μm, and area arrays with spacing of 60 μm were prepared. Each printed wiring board had a total of 400 circular electrode pads. The conductive circuit was made of copper.

An imidazole compound solution of the same type as used in Example 1 was used as the tackiness-imparting compound solution, and tackiness was imparted to the electrode pads. The printed wiring board was then kept in cold water under the same conditions as in Example 2.

A slurry prepared by dispersing 96.5 Sn/3.5Ag solder powder of mean particle size about 60 μm in deoxygenated water to a concentration of 50% by volume was supplied on to the printed wiring board and the board was vibrated at 50 Hz. Then, after mildly vibrating the printed circuit board in deoxygenated water, it was dried.

Flux was sprayed on the printed wiring board, and the board was placed in an oven maintained at 240° C. to melt the solder powder on the board.

96.5Sn/3.5Ag solder bumps of thickness about 40 μm had formed at all the 400 electrode parts on the printed wiring board. The solder bumps had no bridges or other defects.

INDUSTRIAL APPLICABILITY

The present invention enabled the production of electronic circuit boards with remarkably improved reliability, having a uniformly thick solder layer even when the circuit pattern is very fine, and solder bumps of uniform height. As a result, miniaturization and high reliability of circuit boards having fine circuit patterns with highly reliable electronic components mounted on them was able to be realized. Thus the invention enabled the providing of electronic circuit boards, highly reliable circuit boards with high mounting density of electronic components, and electronic devices with superior characteristics.

The invention claimed is:

1. A method of producing a conductive circuit board comprising imparting tackiness through the use of a tackiness-imparting compound to a surface of a conductive circuit on a printed wiring board, attaching a solder powder to the tacky area, and then heating said printed wiring board to melt the solder to form a solder circuit, wherein said printed wiring board is kept at not more than 10° C. after the tackiness is imparted and before the solder powder is attached.

2. A method of producing a conductive circuit board comprising imparting tackiness through the use of a tackiness-imparting compound to a surface of a conductive circuit on a printed wiring board, attaching a solder powder to the tacky area, and then heating said printed wiring board to melt the solder to form a solder circuit, wherein said printed wiring board is kept in a liquid at not more than 10° C. after the tackiness is imparted and before the solder powder is attached.

3. The method of producing a conductive circuit board according to claim 1, wherein the tackiness-imparting compound is a substance containing one or more substances selected from the group consisting of naphthotriazole derivatives, benzotriazole derivatives, imidazole derivatives, benzimidazole derivatives, mercaptobenozothiazole derivatives, and benzothiazole thiofatty acids.

4. The method of producing a conductive circuit board according to claim 2, wherein the temperature of the liquid in which the printed wiring board is kept is not more than 10° C., and is not below the freezing temperature of the liquid.

5. The method of producing a conductive circuit board according to claim 2, wherein the liquid in which the printed wiring board is kept is water.

6. The method of producing a conductive circuit board according to claim 1, wherein the process of attaching the solder powder to the printed wiring board is carried out in a liquid containing the solder powder.

7. The method of producing a conductive circuit board according to claim 6, wherein the liquid is water.

8. The method of producing a conductive circuit board according to claim 6, wherein the solder powder concentration in the liquid is 0.5 to 10% by volume.

9. The method of producing a conductive circuit board according to claim 6, wherein the temperature of the liquid containing the solder powder at the time of attaching the solder powder to the printed wiring board is in the range of 30 to 45° C.

10. The method of producing a conductive circuit board according to claim 2, wherein the tackiness-imparting compound is a substance containing one or more substances selected from the group consisting of naphthotriazole derivatives, benzotriazole derivatives, imidazole derivatives, benzimidazole derivatives, mercaptobenozothiazole derivatives, and benzothiazole thiofatty acids.

11. The method of producing a conductive circuit board according to claim 2, wherein the process of attaching the solder powder to the printed wiring board is carried out in a liquid containing the solder powder.

12. The method of producing a conductive circuit board according to claim 11, wherein the liquid is water.

13. The method of producing a conductive circuit board according to claim 11, wherein the solder powder concentration in the liquid is 0.5 to 10% by volume.

14. The method of producing a conductive circuit board according to claim 11, wherein the temperature of the liquid containing the solder powder at the time of attaching the solder powder to the printed wiring board is in the range of 30 to 45° C.

* * * * *